(12) United States Patent
Xie

(10) Patent No.: US 9,893,034 B2
(45) Date of Patent: Feb. 13, 2018

(54) INTEGRATED CIRCUIT PACKAGES WITH DETACHABLE INTERCONNECT STRUCTURES

(71) Applicant: Altera Corporation, San Jose, CA (US)

(72) Inventor: Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 20 days.

(21) Appl. No.: 14/923,187

(22) Filed: Oct. 26, 2015

(65) Prior Publication Data

US 2017/0117250 A1    Apr. 27, 2017

(51) Int. Cl.
*H01L 23/02* (2006.01)
*H01L 25/065* (2006.01)
*H01L 23/498* (2006.01)
*H01L 25/00* (2006.01)

(52) U.S. Cl.
CPC .... *H01L 25/0652* (2013.01); *H01L 23/49816* (2013.01); *H01L 23/49827* (2013.01); *H01L 23/49838* (2013.01); *H01L 23/49894* (2013.01); *H01L 25/50* (2013.01); *H01L 2224/14* (2013.01); *H01L 2224/16225* (2013.01); *H01L 2225/06513* (2013.01); *H01L 2225/06517* (2013.01)

(58) Field of Classification Search
CPC ......... H01L 23/49816; H01L 23/49827; H01L 23/49838; H01L 23/49894; H01L 25/0652; H01L 25/50
USPC ........................... 257/48, 685, 686, 777, 778
See application file for complete search history.

(56) References Cited

U.S. PATENT DOCUMENTS

| | | | |
|---|---|---|---|
| 2006/0226527 A1* | 10/2006 | Hatano | ............... H01L 23/5389 257/686 |
| 2014/0117552 A1 | 5/2014 | Qian et al. | |
| 2014/0131854 A1* | 5/2014 | Hawk | ................. H01L 23/5385 257/737 |
| 2015/0001733 A1 | 1/2015 | Karhade et al. | |

\* cited by examiner

*Primary Examiner* — Hung Vu

(57) ABSTRACT

An integrated circuit package may include a first integrated circuit die having a first bump structure, a second integrated circuit die having a second bump structure, and a detachable interconnect structure having first and second conductive structures that is positioned between the first and second integrated circuit dies. In order to establish electrical communication between the first and second integrated circuit dies, the first conductive structure of the detachable interconnect structure is connected to the first bump structure of the first integrated circuit die, and the second conductive structure of the detachable interconnect structure is connected to the second bump structure of the second integrated circuit die. The detachable interconnect structure may also be used to facilitate wafer-level testing prior to packaging the first and second integrated circuit dies to form the integrated circuit package.

15 Claims, 8 Drawing Sheets

US 9,893,034 B2

INTEGRATED CIRCUIT PACKAGES WITH DETACHABLE INTERCONNECT STRUCTURES

FIELD OF THE DISCLOSURE

The present disclosure relates to electronic integrated circuit packages, and more particularly, to integrated circuit packages with detachable interconnect structures.

BACKGROUND

In a semiconductor device assembly, an integrated circuit die (also referred to as a semiconductor chip or "die") may be mounted on a semiconductor substrate. Driven by the demand for high performance and lower costs, integrated circuit packages have begun to incorporate multiple die in a single package. However, such integration constitutes a significant challenge in creating reliable stacking structures that can support continuous device scaling and higher operating speed for future generations of integrated circuit devices.

Generally, interconnection structures such as embedded silicon bridges are typically provided at package substrate level to enable high-density die-to-die connection in integrated circuit packages. The use of an embedded silicon bridge eliminates the need for through-silicon vias (TSVs) and interposer structures. However, the process of embedding the silicon bridge may result in a high yield loss. The embedded nature of the silicon bridge may also complicate microbump assembly involving the package substrate and die-to-die connection testing after assembly. Additionally, the implementation of the embedded silicon bridge may necessitate the consumption of an expensive substrate before knowing if the die-to-die connection is good, thereby increasing fabrication costs wasted on bad assemblies.

SUMMARY

In accordance with the present invention, apparatuses and methods are provided for creating integrated circuit packages with detachable interconnect structures.

The present invention can be implemented in numerous ways, such as a process, an apparatus, a system, or a device. Several inventive embodiments of the present invention are described below.

An integrated circuit package is disclosed. The integrated circuit package includes a base substrate with a surface, and first and second conductive structures formed on the surface of the base substrate. The first and second conductive structures are connected together. The integrated circuit package further includes first and second integrated circuit dies. The first conductive structure is connected to the first integrated circuit die through a first conductive interconnect. The second conductive structure is connected to the second integrated circuit die through a second conductive interconnect. The first and second conductive structures are detachable.

Another integrated circuit package is disclosed. The integrated circuit package includes a first integrated circuit die having a first bump structure and a second integrated circuit die having a second bump structure. The integrated circuit package further includes a detachable interconnect structure having first and second conductive structures that are connected together through conductors in the detachable interconnect structure. The detachable interconnect structure is positioned between the first and second integrated circuit dies, whereby the first conductive structure of the detachable interconnect structure is fitted around the first bump structure of the first integrated circuit die, and the second conductive structure is fitted around the second bump structure of the second integrated circuit die.

A method of fabricating an integrated circuit package having first and second integrated circuit dies is disclosed. The method includes forming a removable interconnect structure comprising a base substrate and first and second conductive structures on the base substrate that are coupled together, and attaching the removable interconnect structure to the first and second integrated circuit dies. During the attachment process, the first conductive structure is connected to the first integrated circuit die through a first conductive bump, and the second structure is connected to the second integrated circuit die through a second conductive bump. The first conductive bump may be formed in a peripheral region on the first integrated circuit die, and the second conductive bump may be formed in another peripheral region on the second integrated circuit die.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for creating integrated circuit packages with a detachable interconnect structure.

Figure 1:
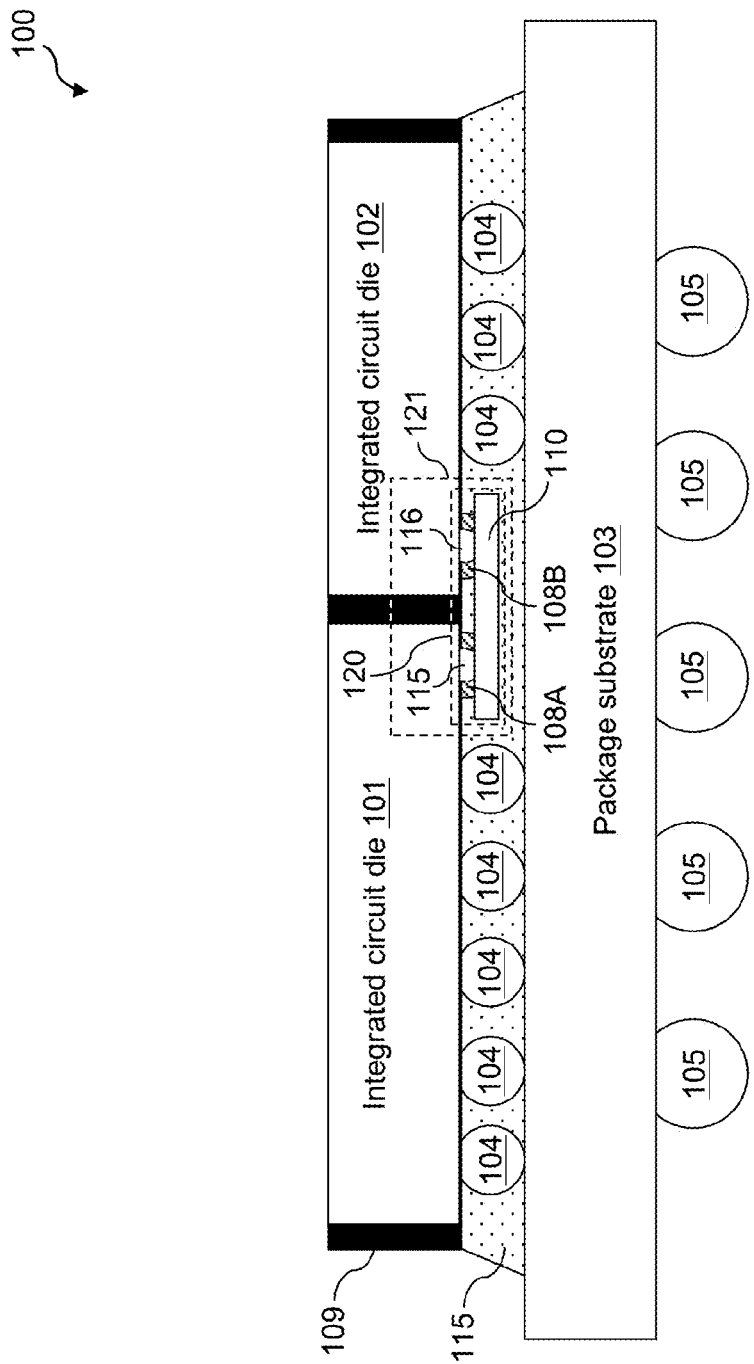
FIG. 1 shows a cross section view of an illustrative integrated circuit package having a detachable interconnect structure in accordance with one embodiment of the present invention.

FIG. 1 shows a cross section view of an illustrative integrated circuit package 100 having a detachable interconnect structure (e.g., interconnect structure 120), in accordance with one embodiment of the present invention. Integrated circuit package 100 includes integrated circuit dies 101 and 102, both of which are positioned adjacent to each other. As used herein, the term "adjacent" means "next to," laterally adjacent, or immediately adjacent. For purposes of this disclosure, two immediately adjacent items (e.g., integrated circuit dies 101 and 102) may or may not be in contact with each other, but there is no other item of the same kind (e.g., another integrated circuit die) that is interposed between the adjacent items. In one embodiment, integrated circuit dies 101 and 102 may be from a same semiconductor wafer. More particularly, a suitable dicing process may be employed to separate the semiconductor wafer (not shown) into a group of individual dies (e.g., integrated circuit dies 101 and 102). Alternatively, integrated circuit dies 101 and 102 may be from two different semiconductor wafers.

As illustrated in FIG. 1, integrated circuit dies 101 and 102 are combined within a single package to form a low-cost packaged circuitry. In one embodiment, integrated circuit dies 101 and 102 can be arranged in a side-by-side configuration without a conventional interposer substrate. In one embodiment, a detachable (or removable) interconnect structure such as interconnect structure 120 may be provided to electrically connect integrated circuit dies 101 and 102 together. It should be noted that, as used herein, the term "detachable" means that the interconnect structure can be or is capable of being physically and completely detached or removed from the integrated circuit die assembly. For example, interconnect structure 120 may include conductive structures 108A and 108B formed on base substrate 110. Conductive structure 108A may electrically connect to conductive structure 108B through metal traces (not shown) in base substrate 110. A more detailed description of interconnect structure 120 will be provided later with reference to FIG. 2.

In order to support the use of interconnect structure 120, a group of conductive interconnects may be formed along a peripheral region of each integrated circuit die. As shown in FIG. 1, conductive interconnects 115 (only one of which is shown in the cross section view of FIG. 1) are formed along a peripheral region of integrated circuit die 101, and conductive interconnects 116 (only one of which is shown in the cross section view of FIG. 1) are formed in another peripheral region of integrated circuit die 102. Conductive interconnects 115 and 116, which are protrusion elements, may facilitate the attachment of interconnect structure 120 to integrated circuit dies 101 and 102 (highlighted in region 121), which will be described later with respect to FIG. 6, so that a side-by-side assembly can be formed. As an example, conductive interconnects 115 and 116 may be bump structures.

Subsequently, the assembly is mounted on package substrate 103 to form integrated circuit package 100. Prior to the mounting of the assembly, integrated circuit dies 101 and 102 may be encapsulated with molding compound 109 to protect them from external contaminants. One or more conductive interconnects (e.g., solder bumps 104) are formed on the front surfaces of integrated circuit dies 101 and 102 to provide electrical connectivity and joint support between integrated circuit dies 101 and 102 and package substrate 103. Additionally, solder balls (e.g., solder balls 105) may be formed on the opposing surface of package substrate 103. Solder balls 105 may provide electrical connection from integrated circuit package 100 to a printed circuit board (not shown), which may also host other circuits.

Figure 2:
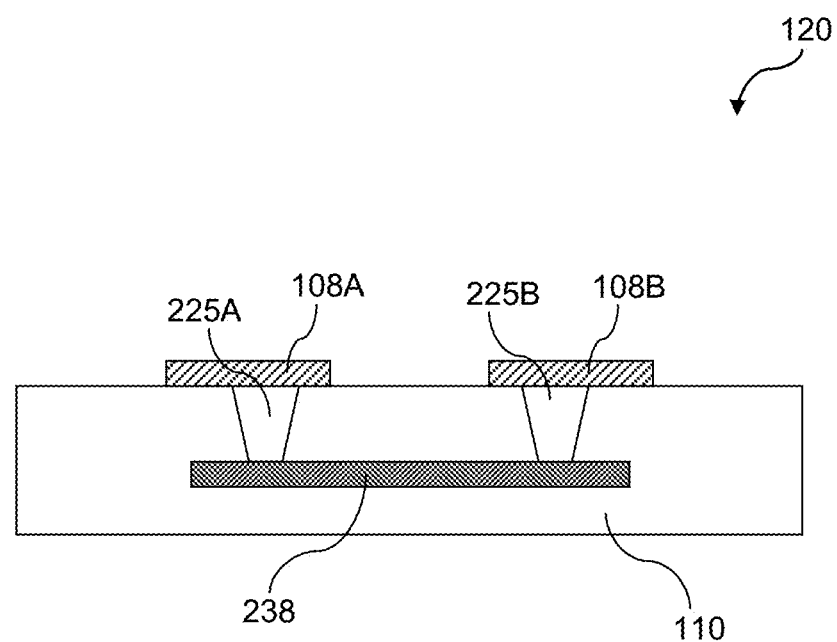
FIG. 2 shows a cross section view of an illustrative detachable interconnect structure in accordance with one embodiment of the present invention.

FIG. 2 shows a cross section view of interconnect structure 120 of FIG. 1 in accordance with one embodiment of the present invention. Interconnect structure 120 includes conductive structures 108A and 108B formed on a surface of base substrate 110. Base substrate 110 may be formed from an insulating and relatively flexible (i.e., bendable) material, such as silicon-based carriers, glass-based carriers, organic-based carriers, or metal-based carriers.

Base substrate 110 includes metal traces 238. In order to facilitate electrical communication between conductive structure 108A and conductive structure 108B, conductive structures 108A and 108B may be connected to metal traces 238 through conductive vias 225A and 225B. Conductive vias 225A and 225B may be formed within base substrate 110 prior to the formation of conductive structures 108A and 108B. For example, conductive vias 225A and 225B are formed by mechanically drilling or laser-drilling base substrate 110 to form holes. The holes are then plated or filled with an electrically conductive metal (e.g., copper) to form the conductive vias.

Figure 3:
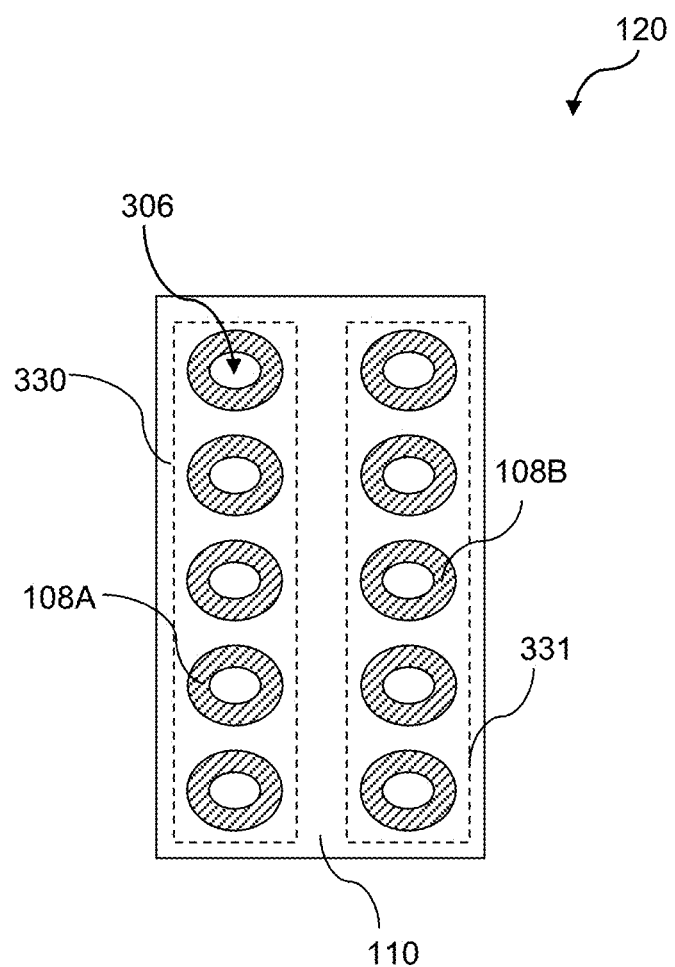
FIG. 3 shows a top view of an illustrative detachable interconnect structure in accordance with one embodiment of the present invention.

FIG. 3 shows a top view of illustrated detachable interconnect structure 120 of FIG. 1 in accordance with one embodiment of the present invention. Conductive structures 108A and 108B may be arranged in two adjacent columns (highlighted in dashed boxes 330 and 331). Each of conductive structures 108A and 108B has a ring-shaped (or annular) body with a center hole (e.g., hole 306), which will be aligned and press-fitted against a corresponding conductive interconnect (e.g. conductive interconnects 115 and 116 of FIG. 1) of an integrated circuit die (e.g., integrated circuit dies 101 and 102 of FIG. 1) to form an electrical connection.

Figure 4:
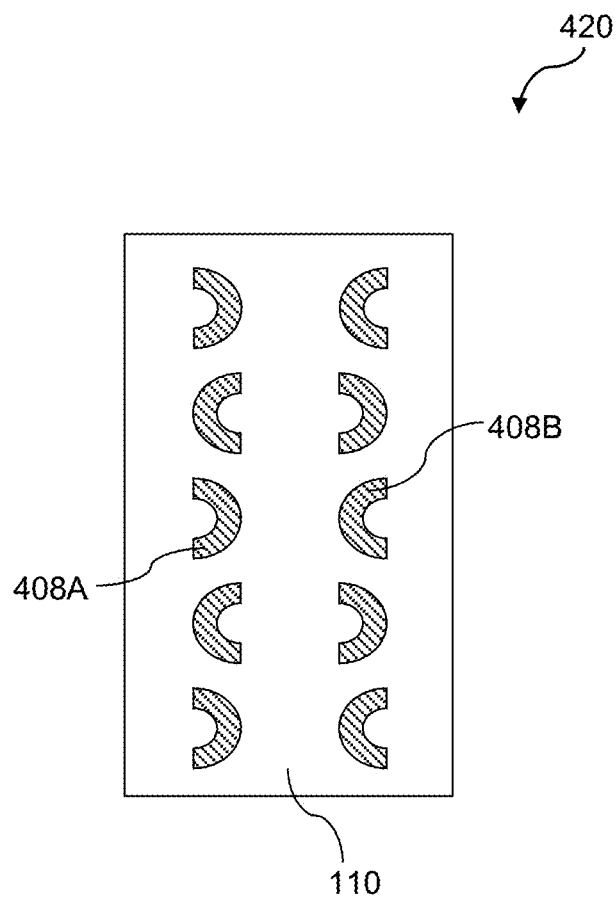
FIGS. 4 and 5 show a top view of different forms of illustrative detachable interconnect structures in accordance with embodiments of the present invention.
Figure 5:
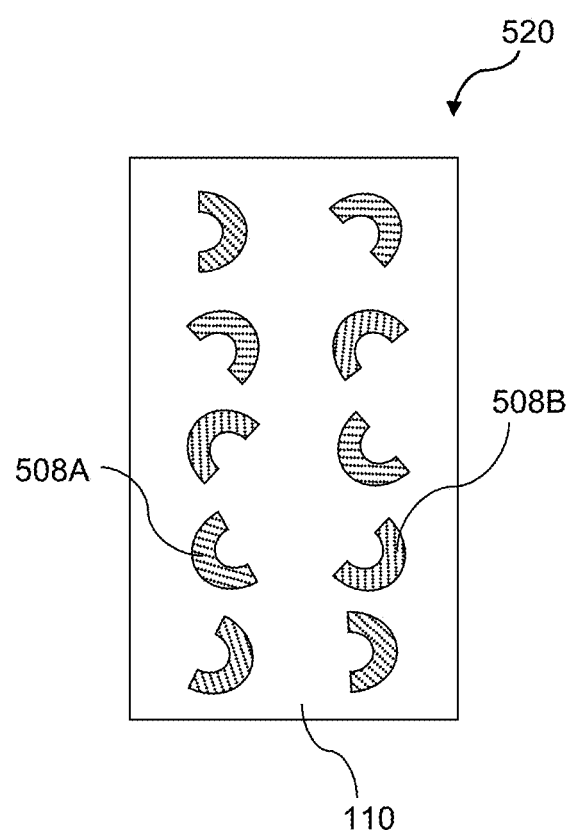

In FIGS. 4 and 5, detachable interconnect structures having different top configurations than interconnect structure 120 shown in FIG. 3, are illustrated in top view. FIG. 4 shows a top view of detachable interconnect structure 420 having conductive structures 408A and 408B formed on base substrate 110. In one embodiment, conductive structures 408A and 408B may have horseshoe-shaped bodies, which can be oriented or aligned in two different directions. The horseshoe-shaped bodies of conductive structures 408A and 408B take up less space on base substrate 110 than conductive structures 108A and 108B, which permits a high density connection. The horseshoe-shaped bodies of conductive structures 408A and 408B also have better tolerance to spacing mismatches between the integrated circuits and the interconnect due to random variability in the manufacturing of the components than conductive structures 108A and 108B.

FIG. 5 shows a top view of detachable interconnect structure 520 having horseshoe-shaped conductive structures 508A and 508B formed on base substrate 110. In contrast to conductive structures 408A and 408B of FIG. 4, the horseshoe-shaped bodies of conductive structures 508A and 508B may be oriented or aligned in at least three different directions. FIG. 5 shows the horseshoe-shaped bodies of conductive structures 508A and 508B being oriented in 5 different directions. Such a configuration allows higher density connection and better tolerance to mismatch.

Figure 6:
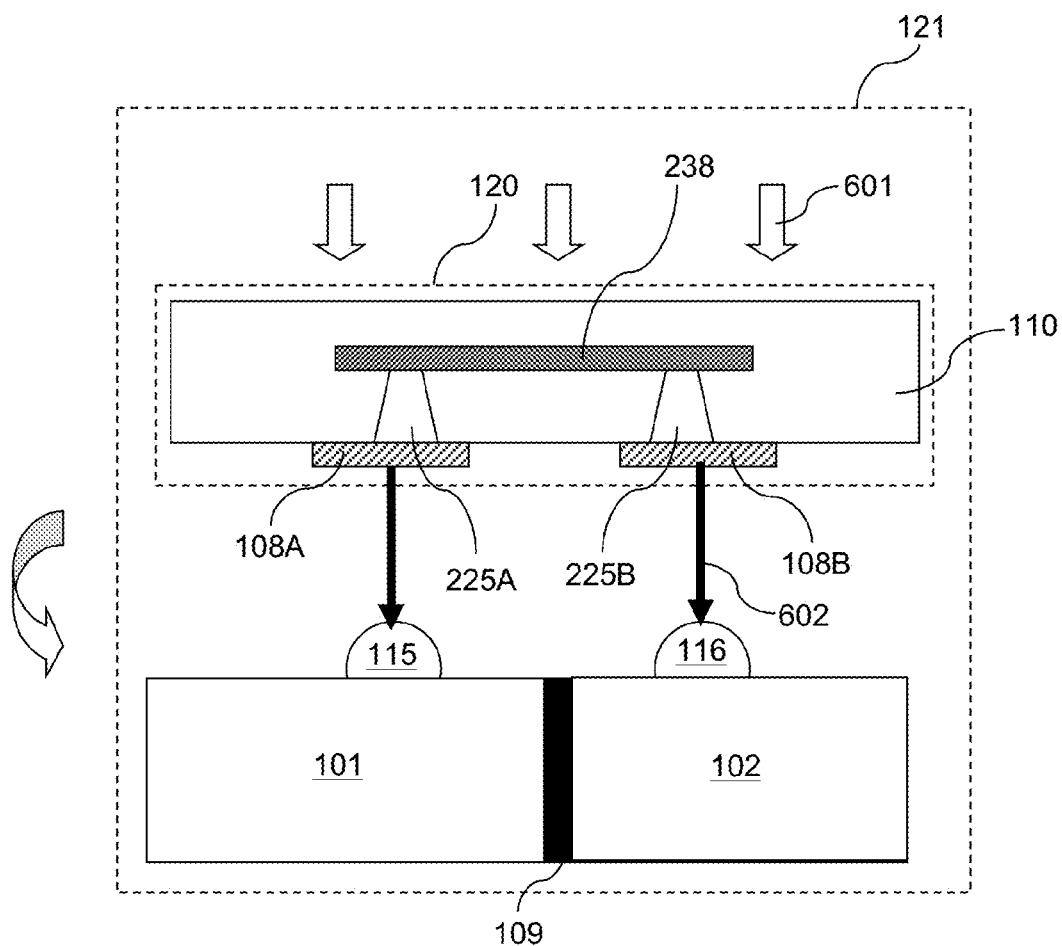
FIG. 6 shows a corresponding circuit diagram of a portion of an integrated circuit package in accordance with one embodiment of the present invention.

FIG. 6 shows a corresponding circuit diagram of a portion of integrated circuit package 100 of FIG. 1 (highlighted in region 121) in accordance with one embodiment of the present invention. It should be appreciated that for the sake of brevity, components already shown in integrated circuit package 100 of FIG. 1 (e.g., integrated circuit dies 101 and 102, molding compound 109, and base substrate 110) and described above will not be repeated.

As mentioned above, interconnect structure 120 may be provided to facilitate signal transmission between integrated circuit die 101 and integrated circuit die 102. Interconnect structure 120 may eliminate the need for an interposer substrate to reduce design and manufacturing expenses. As shown in FIG. 6, interconnect structure 120 is attached to integrated circuit dies 101 and 102 to form a side-by-side configuration. The side-by-side configuration may be accomplished prior to performing package substrate manufacturing and assembly processes.

In order to form the side-by-side configuration, integrated circuit dies 101 and 102 may be flipped or turned over such that conductive interconnects 115 and 116 of integrated circuit dies 101 and 102 face upwards. Accordingly, base substrate 110 of interconnect structure 120 is pressed down (indicated by arrows 601) so that conductive structures 108A and 108B of interconnect structure 120 and conductive interconnects 115 of integrated circuit die 101 and conductive interconnects 116 of integrated circuit die 102, respectively, are snapped together (indicated by arrows 602). As such, a locking configuration (as highlighted in region 121 of FIG. 1) is formed between interconnect structure 120 and integrated circuit dies 101 and 102.

In one embodiment, conductive structures 108A and 108B and associated conductive interconnects 115 and 116 are advantageously designed as complimentary shaped components to ensure that a snug fit is obtained to prevent substantial lateral movement of interconnect structure 120 upon attachment to integrated circuit dies 101 and 102. For example, in an embodiment shown in FIG. 3, conductive interconnects 115 and 116 may be formed in a circular shape with a circumference sized to be received by a center hole (e.g., holes 306 of FIG. 3) of the ring-shaped conductive structures 108A and 108B of interconnect structure 120 to achieve a snug fit. In other examples, as shown in embodiments of FIGS. 4 and 5, each of the conductive interconnects 115 and 116 may be shaped and sized into the form of a half circle so that interconnects 115 and 116 can receive the horseshoe-shaped conductive structures 408A and 408B of interconnect structure 420 and conductive structures 508A and 508B of interconnect structure 520. The complementary nature of interconnect structures 120, 420, and 520 and their complementary components (e.g., conductive interconnects 115 and 116) also allows for easier removal of the interconnect structure from integrated circuit dies 101 and 102 during integrated circuit die testing at wafer-level, which will be described later with respect to FIG. 7.

Figure 7:
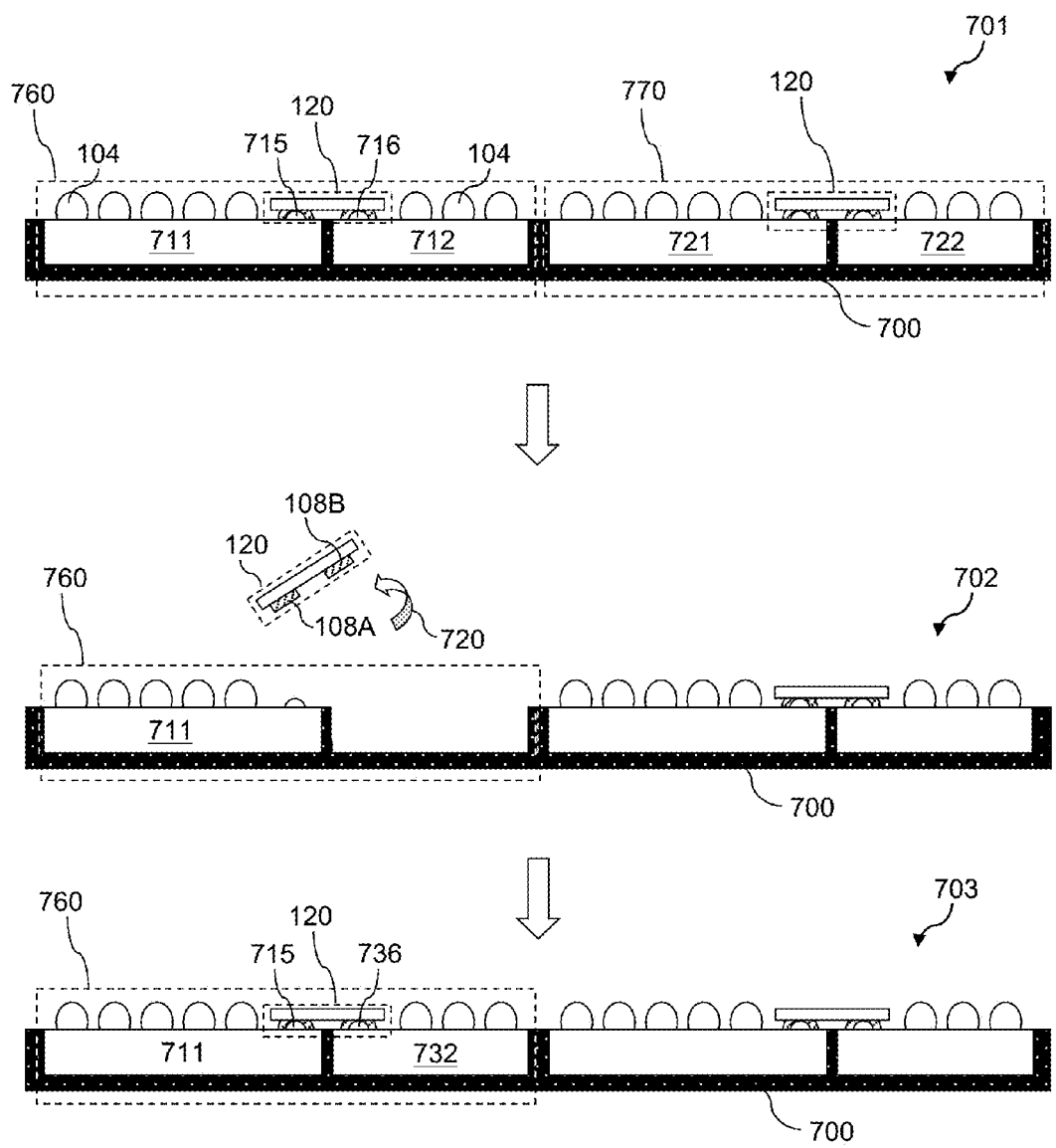
FIG. 7 shows an illustrative diagram of a wafer-level testing process using a detachable interconnect structure in accordance with one embodiment of the present invention.

FIG. 7 shows an illustrative diagram of a wafer-level testing process using a detachable interconnect structure, in accordance with one embodiment of the present invention. During the manufacturing of semiconductor integrated circuits, integrated circuit dies (or semiconductor chips) are functionally tested at the wafer-level prior to singulation (e.g., separating) into individual integrated circuit dies and placement of the dies on a package substrate (e.g., package substrate 103 of FIG. 1). This test is generally referred to as "wafer-level test".

As shown in step 701, a semiconductor wafer 700 with a group of wafer-level assemblies (only two of which are shown by way of example, e.g., wafer-level assemblies 760 and 770), and a test system (not shown) for testing of these wafer-level assemblies on wafer level are provided. Each of wafer-level assemblies 760 and 770 may include two integrated circuit dies (e.g., integrated circuit dies 711 and 712, integrated circuit dies 721 and 722, respectively). It should be noted that semiconductor wafer 700 is a frame structure, which means any integrated circuit die that is formed on wafer 700 can be removed if needed.

In one embodiment, detachable interconnect structures, such as interconnect structure 120 of FIGS. 1-3 and 6, may be used to facilitate wafer-level testing in order to test integrated circuit dies for defects. For the purpose of explanation, integrated circuit dies 711 and 712 of wafer-level assembly 760 will be used as an example to describe the testing of die-to-die connections at steps 702 and 703 in FIG. 7. In order to test the integrated circuit dies for defects, interconnect structure 120 may be attached between integrated circuit dies 711 and 712 to establish die-to-die connections. For example, one or more of conductive interconnects (e.g., conductive interconnects 715) of integrated circuit die 711 are coupled to one or more corresponding conductive interconnects (e.g., conductive interconnects 716) of integrated circuit die 712 through interconnect structure 120. It should be noted that conductive interconnect 715 of integrated circuit die 711 and conductive interconnect 716 of integrated circuit die 712 may be advantageously designed as complimentary shaped components that allow a snug fit of interconnect structure 120 to further facilitate the testing process. Conductive interconnects 715 and 716 correspond to conductive interconnects 115 and 116, respectively.

If any of the integrated circuit dies are found to be defective, the defective integrated circuit die can be replaced with another integrated circuit die at step 702. For example, assume that integrated circuit die 712 is defective. If so, integrated circuit die 712 may be replaced with another integrated circuit die. To facilitate the replacement of integrated circuit die 712, interconnect structure 120 can be removed from integrated circuit dies 711 and 712 (as denoted by arrow 720) by simply pulling interconnect structure 120 away from integrated circuit dies 711 and 712. This approach can be done without requiring any specialized equipment, hence reducing time and costs of integrated circuit package assembly during wafer level testing. For example, as mentioned above in FIG. 2, interconnect structure 120 may include base substrate 110 of FIG. 2, which is formed from an insulating material (e.g., silicon-based carriers, glass-based carriers, organic-based carriers, or metal-based carriers) that is flexible to facilitate easier attachment and removal of interconnect structure 120 during wafer level testing.

Once interconnect structure 120 is removed, the defective integrated circuit die 712 can be detached from semiconductor wafer 700 and replaced with another integrated circuit die (e.g., integrated circuit die 732) at step 703. The new assembly of integrated circuit dies 711 and 732 in wafer-level assembly 760 can then be retested. These steps may be repeated as necessary until a satisfactory test is obtained. Alternatively, in another embodiment, interconnect structure 120 may also be tested for detect, using the same method as described above. If interconnect structure 120 is tested to be defective, interconnect structure 120 can be replaced with a new interconnect structure.

Figure 8:
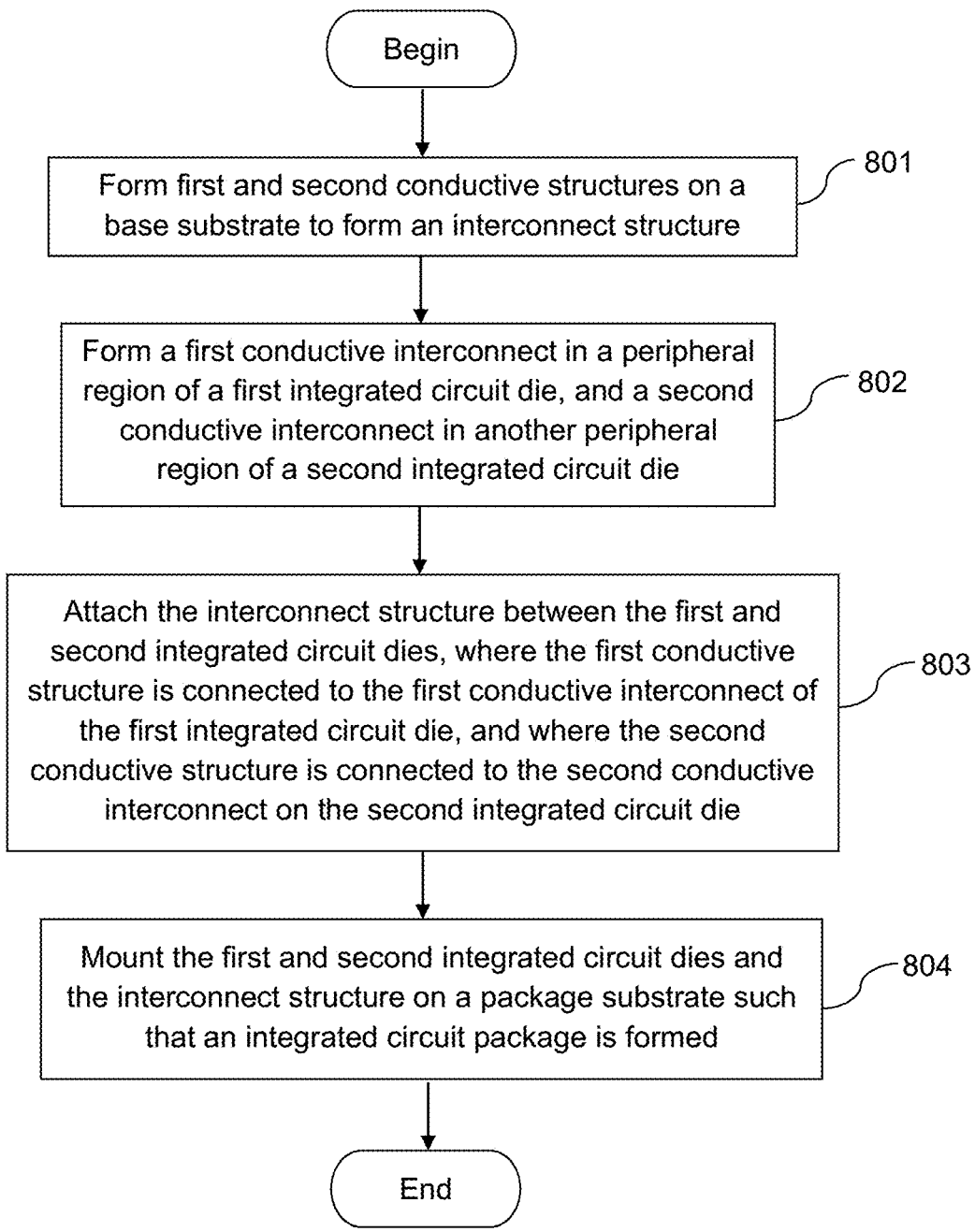
FIG. 8 is a flow chart of illustrative steps to assemble an integrated circuit package, in accordance with one embodiment of the present invention.

FIG. 8 is a flow chart of illustrative steps to assemble an integrated circuit package, in accordance with one embodiment of the present invention. At step 801, first and second conductive structures are formed on a base substrate to form an interconnect structure. With reference to FIG. 2, conductive structures 108A and 108B may be formed on the surface of base substrate 110 to form interconnect structure 120. Conductive structures 108A and 108B are electrically connected to each other via metal traces 238 in base substrate 110. To do so, conductive vias 225A and 225B are fabricated to connect conductive structures 108A and 108B to metal traces 238. In one embodiment, conductive structures 108A and 108B may be composed of ring-shaped bodies (as shown in FIG. 3), or other shaped bodies such as horseshoe-shaped bodies (e.g., conductive structures 408A and 408B of FIG. 4, or conductive structures 508A and 508B of FIG. 5).

At step 802, a first conductive interconnect is formed in a peripheral region of a first integrated circuit die, and a second conductive interconnect is formed in another peripheral region of a second integrated circuit die. It should be noted that the formations of the first and second conductive interconnects on the respective integrated circuit dies may not necessarily occur at the same time, or by the same fabrication process. For example, as shown in FIG. 6, conductive interconnect 115 is formed in a peripheral region of integrated circuit die 101, and conductive interconnect 116 is formed in another peripheral region of integrated circuit die 102. As an example, conductive interconnects 115 and 116 may be bump structures.

At step 803, the interconnect structure is attached between the first and second integrated circuit dies, such that the first conductive structure is connected to the first conductive interconnect of the first integrated circuit die, and the second conductive structure is connected to the second conductive interconnect on the second integrated circuit die. For example, as shown in FIG. 6, interconnect structure 120 is attached to integrated circuit dies 101 and 102 by pressing down (indicated by arrows 601) base substrate 110 of interconnect structure 120 onto integrated circuit dies 101 and 102 so that conductive structures 108A and 108B are fitted around conductive interconnects 115 and 116, respectively. In one embodiment, the first and second conductive interconnects may be designed as complementary shaped components to first and second conductive structures of the interconnect structure to ensure that a snug fit is obtained to prevent substantial lateral movement of the interconnect structure upon its attachment to integrated circuit dies. For example, conductive interconnects 115 and 116 may be circularly-shaped and snugly fitted down into the ring-shaped bodies of conductive structures 108A and 108B of interconnect structure 120. In another example, conductive interconnects 115 and 116 may be half circle-shaped and snugly fitted down into the horseshoe-shaped bodies of conductive structures 408A and 408B of interconnect structure 420.

At step 804, the first and second integrated circuit dies, and the interconnect structure are mounted on a package substrate such that an integrated circuit package is formed. For example, as shown in FIG. 1, the assembled integrated circuit dies 101 and 102 and interconnect structure 120 are mounted on package substrate 103 to form integrated circuit package 100. Prior to the package substrate manufacturing and assembly processes, integrated circuit dies 101 and 102 may undergo wafer-level testing, which is facilitated by the interconnect structure 120 to determine whether any of the integrated circuit dies or the interconnect structure is defective, as described above with respect to FIG. 7.

It should be understood that the present exemplary embodiments may be practiced without some or all of these specific details described with reference to the respective embodiments. In other instances, well-known operations have not been described in detail in order not to obscure unnecessarily the present embodiments.

The methods and apparatuses described herein may be incorporated into any suitable circuit. For example, the methods and apparatuses may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

What is claimed is:

1. An integrated circuit package, comprising:
   a base substrate with a surface;
   first and second conductive structures formed on the surface of the base substrate, wherein the first and second conductive structures are coupled together, wherein each of the first and second conductive structures comprises a ring-shaped body; and
   first and second integrated circuit dies, wherein the ring-shaped body of the first conductive structure is fitted around a first bump structure on the first integrated circuit die to cause the first conductive structure to be coupled to the first integrated circuit die through the first bump structure, and wherein the ring-shaped body of the second conductive structure is fitted around a second bump structure on the second integrated circuit die to cause the second conductive structure to be coupled to the second integrated circuit die through the second bump structure, and wherein the first and second conductive structures are detachable from the first and second integrated circuit dies.

2. The integrated circuit package defined in claim 1, wherein the first bump structure is formed in a peripheral region of the first integrated circuit die, and wherein the second bump structure is formed in another peripheral region of the second integrated circuit die.

3. The integrated circuit package defined in claim 1, wherein the base substrate is formed from a material selected from a group consisting of glass, silicon, and rubber.

4. The integrated circuit package defined in claim 1, wherein the ring-shaped body of each of the first and second conductive structures is on the surface of the base substrate.

5. The integrated circuit package defined in claim 1, wherein the base substrate is formed from a polymeric material.

6. The integrated circuit package defined in claim 1, wherein the base substrate further comprises conductive traces coupled to the first and second conductive structures through conductive vias.

7. The integrated circuit package defined in claim 1 further comprising:
   a package substrate; and
   conductive interconnects on surfaces of the first and second integrated circuit dies and the package substrate, wherein the conductive interconnects provide electrical connectivity between the first and second integrated circuit dies and the package substrate.

8. An integrated circuit package, comprising:
   a first integrated circuit die having a first bump structure;
   a second integrated circuit die having a second bump structure; and
   a detachable interconnect structure having first and second conductive structures that are coupled together through conductors in the detachable interconnect structure, wherein the detachable interconnect structure is positioned between the first and second integrated circuit dies, wherein each of the first and second conductive structures comprises a ring-shaped body, wherein the ring-shaped body of the first conductive structure of the detachable interconnect structure is fitted around the first bump structure of the first integrated circuit die causing the first conductive structure to be coupled to the first integrated circuit die through the first bump structure, and wherein the ring-shaped body of the second conductive structure of the detachable interconnect structure is fitted around the second bump structure of the second integrated circuit die causing the second conductive structure to be coupled to the second integrated circuit die through the second bump structure.

9. The integrated circuit package defined in claim 8, wherein the detachable interconnect structure further comprises a base substrate having a surface, wherein the first and second conductive structures are formed on the surface of the base substrate.

10. The integrated circuit package defined in claim 9, wherein the conductors in the detachable interconnect structure comprise a plurality of conductive traces, and wherein each of the first and second conductive structures is electrically coupled to the plurality of conductive traces through a corresponding conductive via.

11. The integrated circuit package defined in claim 10, wherein the base substrate is formed from a polymeric material.

12. The integrated circuit package defined in claim 10, wherein the base substrate comprises a material selected from a group consisting of glass, silicon, and rubber.

13. The integrated circuit package defined in claim 9, wherein the ring-shaped body of each of the first and second conductive structures is on the surface of the base substrate.

14. The integrated circuit package defined in claim 8, wherein the first and second conductive structures are adjacent to each other.

15. The integrated circuit package defined in claim 8 further comprising:
a package substrate; and
conductive interconnects on surfaces of the first and second integrated circuit dies and the package substrate, wherein the conductive interconnects provide electrical connectivity between the first and second integrated circuit dies and the package substrate.

* * * * *